(12) United States Patent
Feng

(10) Patent No.: US 6,417,037 B1
(45) Date of Patent: Jul. 9, 2002

(54) METHOD OF DUAL GATE PROCESS

(75) Inventor: Gao Feng, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/618,674

(22) Filed: Jul. 18, 2000

(51) Int. Cl.$^7$ ........................................ H01L 21/8238
(52) U.S. Cl. ..................... 438/216; 438/199; 438/275; 438/287; 438/591; 438/770; 438/775; 257/369; 257/411
(58) Field of Search .................. 438/199, 216, 438/275, 287, 770, 775, 591, 765, 769; 257/411, 369, 395

(56) References Cited

U.S. PATENT DOCUMENTS

| | | | |
|---|---|---|---|
| 4,419,812 A | * 12/1983 | Topich ........................ 29/571 |
| 5,057,449 A | 10/1991 | Lowrey et al. .............. 438/251 |
| 5,244,843 A | 9/1993 | Chau et al. ................. 438/452 |
| 5,538,923 A | 7/1996 | Gardner et al. ............. 438/264 |
| 5,668,035 A | 9/1997 | Fang et al. ................. 438/239 |
| 5,863,819 A | 1/1999 | Gonzalez .................... 438/238 |
| 5,880,040 A | * 3/1999 | Sun et al. ................... 438/769 |
| 5,882,993 A | 3/1999 | Gardner et al. ............. 438/591 |
| 5,918,133 A | 6/1999 | Gardner et al. ............. 438/299 |
| 5,960,289 A | * 9/1999 | Tsui et al. .................. 438/275 |
| 6,080,682 A | 6/2000 | Ibok .......................... 438/770 |
| 6,107,134 A | * 8/2000 | Lu et al. ..................... 438/239 |
| 6,200,834 B1 | * 3/2001 | Bronner et al. ............. 438/142 |
| 6,218,234 B1 | * 4/2001 | Yu et al. ..................... 438/241 |

FOREIGN PATENT DOCUMENTS

TW 383411 3/2000

* cited by examiner

Primary Examiner—Long Pham
Assistant Examiner—Hsien Ming Lee
(74) Attorney, Agent, or Firm—George O. Saile; Stephen B. Ackerman

(57) ABSTRACT

A new method for forming dual gate dielectrics having high quality where both thin and thick gate dielectric thicknesses can be controlled separately is described. An isolation region separates a first active area from a second active area in a semiconductor substrate. A first gate dielectric layer is formed overlying the semiconductor substrate in the first and second active areas wherein the first gate dielectric layer has a first electrical thickness. The first gate dielectric layer in the second active area is removed. A second gate dielectric layer is formed in the second active area wherein the second gate dielectric layer has a second electrical thickness greater than the first electrical thickness and wherein the second gate dielectric layer is nitrided. A polysilicon layer is deposited overlying the first and second gate dieectric layers. The layers are patterned to form a first gate transistor in the first active area having the first gate dielectric layer thereunder and to form a second gate transistor in the second active area having the second gate dielectric layer thereunder.

32 Claims, 3 Drawing Sheets

METHOD OF DUAL GATE PROCESS

BACKGROUND OF THE INVENTION (1) Field of the Invention

The present invention relates to a method of fabricating an integrated circuit device, and more particularly, to a method of fabricating an integrated circuit device having a dual gate oxide process.

(2) Description of the Prior Art

Dual gate oxide thicknesses are often required in making integrated circuit devices. For example, a thin gate oxide might be needed for a low voltage, low power dissipation device and a thick gate oxide may be needed for a high voltage, high speed, high current drive device built on the same integrated circuit. Typically, a first oxide layer is grown over a substrate. The first oxide layer is etched away in one area. A second oxide is grown where the first oxide was removed to form the thin gate oxide. The second oxide over the first oxide forms a thick gate oxide. However, the surface of the first oxide becomes rough after etchback, so the quality of the thick oxide may not be good. Since the first oxide contains no nitrogen, the thick oxide may not contain enough nitrogen to block boron penetration.

U.S. Pat. No. 5,882,993 to Gardner et al shows a dual oxide process in which a nitrogen-bearing impurity concentration within a portion of the substrate retards oxidation in that area. U.S. Pat. No. 5,918,133 to Gardner et al also teaches a nitrogen-bearing implant in one area that results in dual oxide thicknesses. U.S. Pat. No. 5,668,035 to Fang et al, U.S. Pat. No. 5,057,449 to Lowrey et al, U.S. Pat. No. 5,863,819 to Gonzalez, U.S. Pat. No. 5,244,843 to Chau et al, and U.S. Pat. No. 5,538,923 to Gardner et al show various dual gate silicon oxide methods.

SUMMARY OF THE INVENTION

Accordingly, it is a primary object of the invention to provide an effective and very manufacturable process for fabricating dual gate oxides in the fabrication of integrated circuits.

Another object of the present invention is to provide a method for forming dual gate oxides where both thin and thick gate oxide thicknesses can be controlled separately.

A further object of the invention is to provide a method for forming dual gate oxides of high quality where both thin and thick gate oxide thicknesses can be controlled separately.

In accordance with the objects of this invention, a method for forming dual gate dielectrics having high quality where both thin and thick gate dielectric thicknesses can be controlled separately is achieved. An isolation region separates a first active area from a second active area in a semiconductor substrate. A first gate dielectric layer is formed overlying the semiconductor substrate in the first and second active areas wherein the first gate dielectric layer has a first electrical thickness. The first gate dielectric layer in the second active area is removed. A second gate dielectric layer is formed in the second active area wherein the second gate dielectric layer has a second electrical thickness greater than the first electrical thickness and wherein the second gate dielectric layer is nitrided. A polysilicon layer is deposited overlying the first and second gate dieectric layers. The layers are patterned to form a first gate transistor in the first active area having the first gate dielectric layer thereunder and to form a second gate transistor in the second active area having the second gate dielectric layer thereunder.

BRIEF DESCRIPTION OF THE DRAWINGS

In the following drawings forming a material part of this description, there is shown.

DESCRIPTION OF THE PREFERRED EMBODIMENTS

Figure 1:
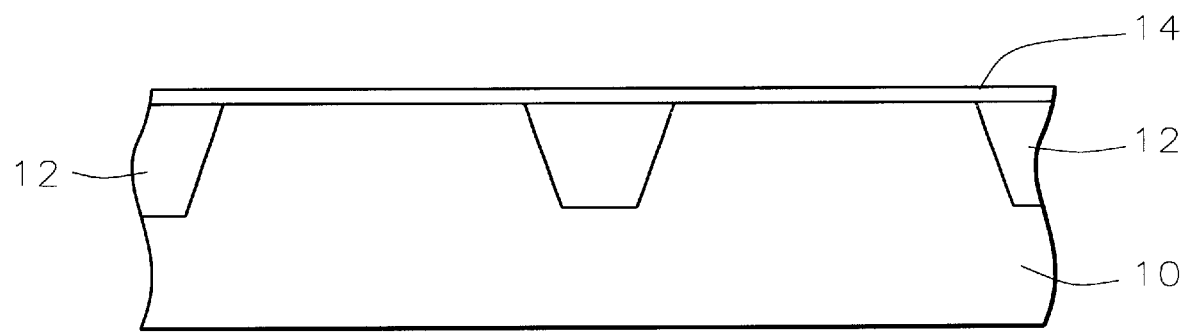
FIGS. 1 through 6 are schematic cross-sectional representations of a preferred embodiment of the present invention.

Referring now more particularly to FIG. 1, there is shown a partially completed integrated circuit device. The semiconductor substrate 10 is preferably composed of silicon having a (100) crystallographic orientation. Isolation regions are formed to separate active areas from one another. For example, shallow trench isolation (STI) regions 12 are formed in the semiconductor substrate as shown in FIG. 1. A sacrificial oxide is grown over the surface of the substrate and channel implantations are made, as is conventional in the art, and not shown. The sacrificial oxide layer is removed and the substrate is cleaned, such as by an RCA clean.

Now, the novel dual gate dielectric process of the invention will be described. An ultra-thin silicon nitride or silicon oxynitride film 14 is grown on the surface of the substrate by low pressure chemical vapor deposition (LPCVD) or rapid thermal chemical vapor deposition (RTCVD) to a thickness of between about 20 and 100 Angstroms.

In the LPCVD process, in a first step, silicon and oxygen are flowed at about 800° C., to form a buffer oxide a few Angstroms thick, about 5 to 10 Angstroms. Alternatively, NO is used in place of the oxygen to form a silicon oxynitride film about 5 to 10 Angstroms thick. In a second step, silicon ($SiH_4$)+a nitrogen source, which may be $N_2$ or $NH_3$, are flowed to form the remaining silicon nitride layer having a thickness of 15 to 90 Angstroms. The total thickness of the thin dielectric layer 14 is 20 to 100 Angstroms.

In the RTCVD process, in a first step, silicon and NO are flowed at about 800° C., to form a silicon oxynitride film a few Angstroms thick, about 5 to 10 Angstroms. In a second step, silicon ($SiH_4$)+a nitrogen source, which may be $N_2$ or $NH_3$, are flowed to form the remaining silicon nitride layer having a thickness of 15 to 90 Angstroms. Optionally, an in-situ anneal using $NH_3$ at 950 ° C. for 30 seconds or $N_2O$ at 850° C. for 30 seconds may be added. The total thickness of the thin dielectric layer 14 is 20 to 100 Angstroms.

The composition of the film 14 is: silicon 40–60%, nitrogen 40–70%, and oxygen 1–10%. This film 14 will form a thin gate nitride layer or a silicon oxynitride layer. The nitride film 14 will serve as an oxygen blocking material to form the thin gate dielectric. The layer 14 is a nitride-rich silicon oxynitride layer.

Figure 2:
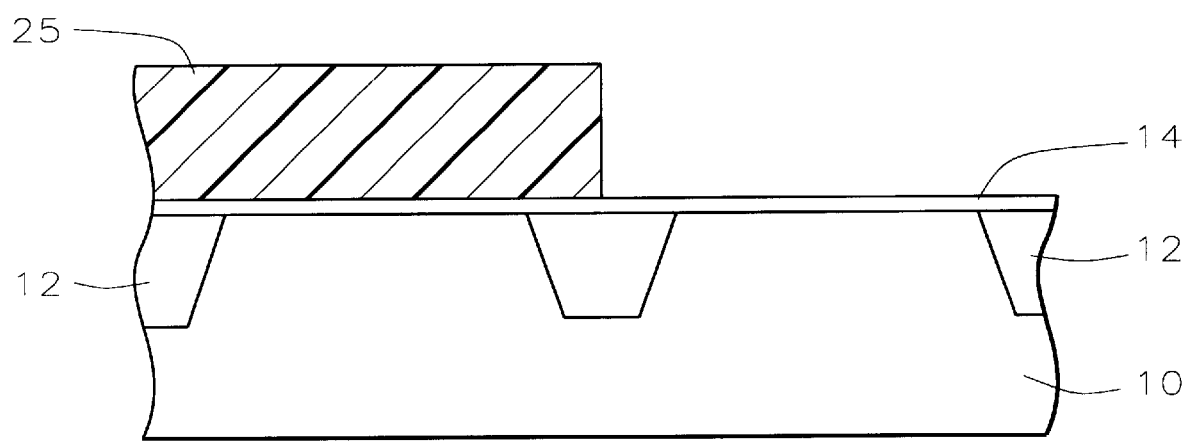

A mask is formed over the substrate, covering the thin gate nitride area and exposing the planned thick gate oxide area. FIG. 2 illustrates, for example, a photoresist mask 25 covering the thin gate nitride area.

Figure 3:
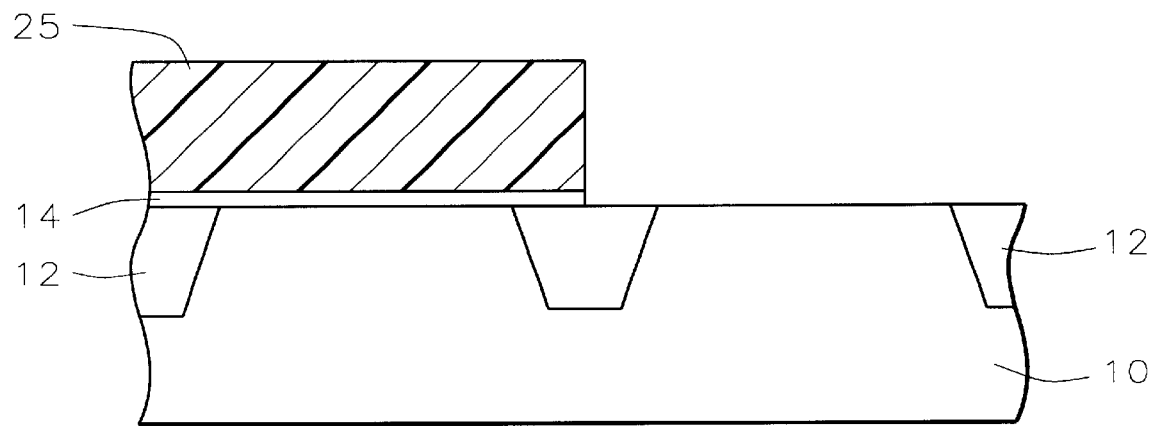

The thin gate nitride layer 14 is etched away where it is not covered by the mask 25, stopping at the silicon substrate surface, as shown in FIG. 3.

Figure 4:
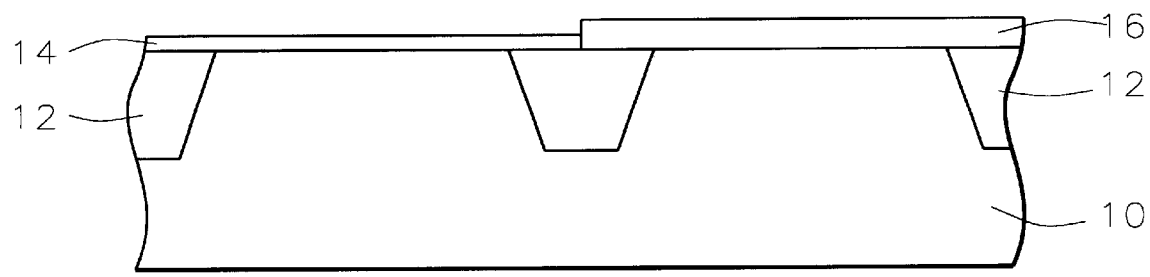

Now, the mask is removed and a pre-gate cleaning step is performed. A thick gate dielectric layer is now grown in the thick gate dielectric area, using NO or $N_2O$ to form a nitrided oxide layer 16 having a thickness of between about 30 and 100 Angstroms, and more preferably between about 50 and 100 Angstroms, as shown in FIG. 4.

The thick gate dielectric layer 16 is grown by one of two options. In the first option, silicon dioxide is thermally grown followed by an anneal in NO, $NH_3$ or $N_2O$ to form silicon oxynitride 16 having the following composition silicon: 30–35%, nitrogen 1–5%, and oxygen 61–67%. In the second option, NO or $N_2O$ plus oxygen are flowed along with silicon to form an oxygen-rich silicon oxynitride layer having the same overall composition as in the first option, but being nitrogen-rich in the top portion of the layer. The growth temperature for both options should be between about 800 and 950° C. The thin gate dielectric 14 will also be increased in thickness by about 1 to 10 Angstroms, depending on the thick dielectric growth recipe.

Both the thin gate dielectric and the thick gate dielectric layers 14 and 16, respectively, will be able to block boron penetration from the polysilicon gate. "Thin" and "thick" refer to the electrical characteristics of the dielectric layers since both layers have a similar physical thickness. The two layers are formed by different processes. The thin gate dielectric layer 14 is a nitrogen rich silicon nitride or silicon oxynitride layer. Because of the higher concentration of nitrogen, layer 14 has a higher dielectric constant than layer 16. Thick gate dielectric layer 16 is an oxygen-rich silicon oxynitride layer.

Figure 5:
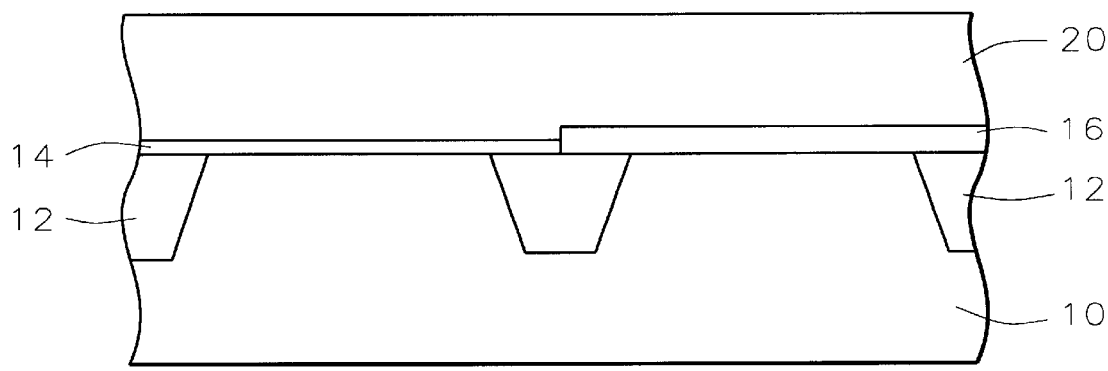

Referring now to FIG. 5, a polysilicon layer 20 is deposited over the substrate by LPCVD to a thickness of between about 1000 and 3000 Angstroms. The polysilicon layer is patterned to form the thin gate transistor 22 and the thick gate transistor 24.

This completes the dual gate process of the invention. The thin gate nitride 14 has been formed underlying the thin gate transistor 22. The thick nitrided gate oxide 16 has been formed underlying the thick gate transistor 24. Since the thick gate oxide has been grown on the substrate and not on a previously etched back portion of oxide, it has high quality.

Figure 6:
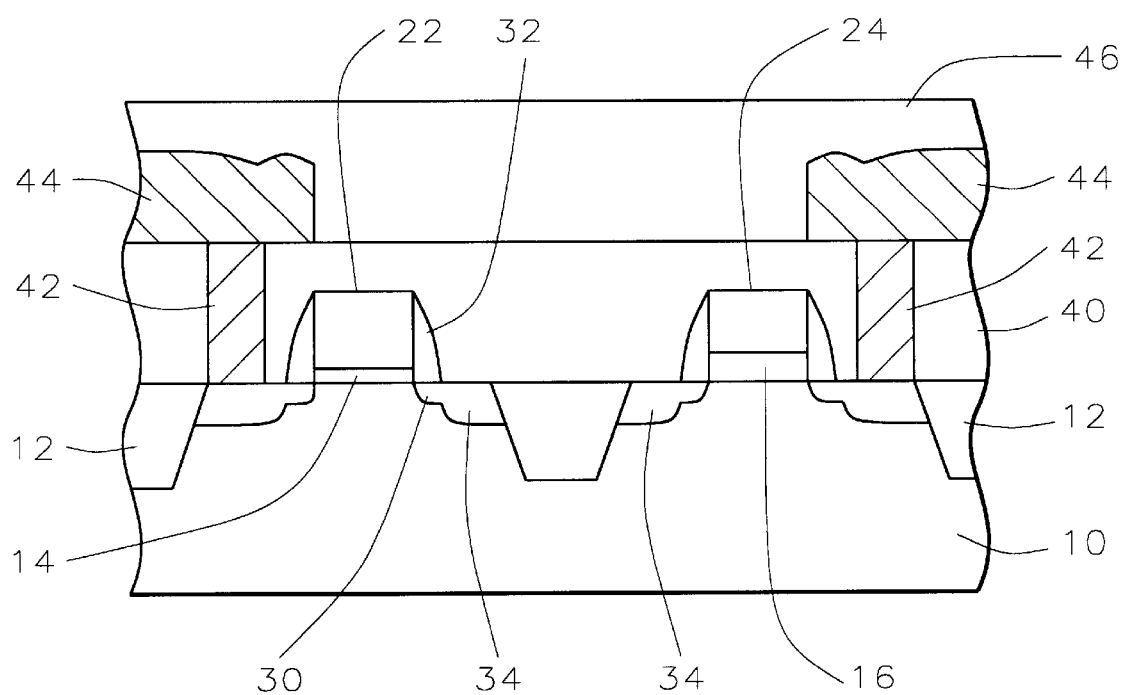

Processing continues as is conventional in the art to complete the integrated circuit device. For example, as shown in FIG. 6, lightly doped regions 30 are formed within the semiconductor substrate adjacent to the transistors 22 and 24. Spacers 32, comprising silicon oxide or silicon nitride, for example, are formed on the sidewalls of the transistors 22 and 24. Source and drain regions 34 are then formed within the semiconductor substrate associated with the transistors 22 and 24, as is conventional in the art. Contact openings are made through an insulating layer 40 to the substrate over the source and drain regions, for example. The openings are filled with a conducting layer, such as tungsten plugs 42. Another conducting layer 44, such as aluminum or an aluminum alloy, may be deposited and patterned to complete the contacts as shown. A passivation layer, such as silicon nitride layer 46, completes the integrated circuit device.

The process of the invention forms both thin gate dielectric and thick gate dielectric thicknesses that can be separately controlled. The quality of the resulting dielectrics is very good.

While the invention has been particularly shown and described with reference to the preferred embodiments thereof, it will be understood by those skilled in the art that various changes in form and details may be made without departing from the spirit and scope of the invention.

What is claimed is:

1. A method for fabricating an integrated circuit device comprising:

providing an isolation region separating a first active area from a second active area in a semiconductor substrate;

forming a first gate dielectric layer overlying said semiconductor substrate in said first and second active areas wherein said first gate dielectric layer has a first electrical thickness;

annealing said first gate dielectric layer using one of the group containing $NH_3$ and $N_2O$ to form a nitrogen-rich silicon oxynitride layer;

removing said first gate dielectric layer in said second active area;

forming a second gate dielectric layer in said second active area wherein said second gate dielectric layer has a second electrical thickness greater than said first electrical thickness and wherein said second gate dielectric layer is nitrided to form an oxygen-rich silicon oxynitride layer;

depositing a polysilicon layer overlying said first and second gate dielectric layers;

patterning said polysilicon layer and said first and second gate dielectric layers to form a first gate transistor in said first active area having said first gate dielectric layer thereunder and to form a second gate transistor in said second active area having said second gate dielectric layer thereunder; and completing said integrated circuit device.

2. The method according to claim 1 wherein said first gate dielectric layer has a physical thickness of between about 20 and 100 Angstroms.

3. The method according to claim 1 wherein said first gate dielectric layer is formed by LPCVD silicon nitride wherein a first buffer oxide layer is formed to a thickness of between about 5 and 10 Angstroms underlying a silicon nitride layer wherein the total physical thickness of said first gate dielectric layer is between about 30 and 100 Angstroms.

4. The method according to claim 1 wherein said first gate dielectric layer is formed by LPCVD silicon nitride wherein a first buffer oxynitride layer is formed to a thickness of between about 5 and 10 Angstroms underlying a silicon nitride layer wherein the total physical thickness of said first gate dielectric layer is between about 30 and 100 Angstroms.

5. The method according to claim 1 wherein said first gate dielectric layer is formed by RTCVD silicon nitride wherein a first buffer oxynitride layer is formed to a thickness of between about 5 and 10 Angstroms underlying a silicon nitride layer wherein the total physical thickness of said first gate dielectric layer is between about 30 and 100 Angstroms.

6. The method according to claim 1 wherein said first gate dielectric layer has a composition of silicon: 40–60%, nitrogen 40–70%, and oxygen 1–10%.

7. The method according to claim 1 wherein said second gate dielectric layer is grown by thermally growing a silicon dioxide layer and annealing said silicon dioxide layer using one of the group containing $NH_3$ and $N_2O$ and wherein the physical thickness of said second gate dielectric layer is between about 30 and 100 Angstroms.

8. The method according to claim 1 wherein said second gate dielectric layer is grown by thermally growing a silicon oxynitride layer using one of the group containing NO and $N_2O$ and wherein the physical thickness of said second gate dielectric layer is between about 30 and 100 Angstroms.

9. The method according to claim 1 wherein said second gate dielectric layer has a composition of silicon: 30–35%, nitrogen 1–5%, and oxygen 61–67%.

10. The method according to claim 1 further comprising:
    forming source and drain regions in said semiconductor substrate adjacent to said first and second gate transistors;
    depositing an insulating layer overlying said semiconductor substrate and said first and second gate transistors;
    opening contact holes through said insulating layer to underlying said source and drain regions;
    filling said contact holes with a conducting layer and patterning said conducting layer; and
    depositing a passivation layer overlying said patterned conducting layer to complete said integrated circuit device.

11. A method for fabricating an integrated circuit device comprising:
    providing an isolation region separating a first active area from a second active area in a semiconductor substrate;
    forming a nitrogen-rich gate nitride layer overlying said semiconductor substrate in said first and second active areas wherein said gate nitride layer has a first electrical thickness;
    removing said gate nitride layer in said second active area;
    forming an oxygen-rich nitrided gate oxide layer in said second active area wherein said nitrided gate oxide layer has a second electrical thickness greater than said first electrical thickness;
    depositing a polysilicon layer overlying said gate nitride layer and said nitrided gate oxide layer;
    patterning said polysilicon layer, said gate nitride layer, and said nitrided gate oxide layer to form a first gate transistor in said first active area having said gate nitride layer thereunder and to form a second gate transistor in said second active area having said nitrided gate oxide layer thereunder; and
    completing said integrated circuit device.

12. The method according to claim 11 wherein said gate nitride layer has a physical thickness of between about 20 and 100 Angstroms.

13. The method according to claim 11 wherein said gate nitride layer is formed by LPCVD silicon nitride wherein a first buffer oxide layer is formed to a thickness of between about 5 and 10 Angstroms underlying a silicon nitride layer wherein the total physical thickness of said gate nitride layer is between about 30 and 100 Angstroms.

14. The method according to claim 11 wherein said gate nitride layer is formed by LPCVD silicon nitride wherein a first buffer oxynitride layer is formed to a thickness of between about 5 and 10 Angstroms underlying a silicon nitride layer wherein the total physical thickness of said gate nitride layer is between about 30 and 100 Angstroms.

15. The method according to claim 11 wherein said gate nitride layer is formed by RTCVD silicon nitride wherein a first buffer oxynitride layer is formed to a thickness of between about 5 and 10 Angstroms underlying a silicon nitride layer wherein the total physical thickness of said gate nitride layer is between about 30 and 100 Angstroms.

16. The method according to claim 15 further comprising annealing said gate nitride layer using one of the group containing $NH_3$ and $N_2O$.

17. The method according to claim 11 wherein said gate nitride layer has a composition of silicon: 40–60%, nitrogen 40–70%, and oxygen 1–10%.

18. The method according to claim 11 wherein said nitrided gate oxide layer is grown by thermally growing a silicon dioxide layer and annealing said silicon dioxide layer using one of the group containing $NH_3$ and $N_2O$ and wherein the physical thickness of said nitrided gate oxide layer is between about 30 and 100 Angstroms.

19. The method according to claim 11 wherein said nitrided gate oxide layer is grown by thermally growing a silicon oxynitride layer using one of the group containing NO and $N_2O$ and wherein the physical thickness of said nitrided gate oxide layer is between about 30 and 100 Angstroms.

20. The method according to claim 11 wherein said nitrided gate oxide layer has a composition of silicon: 30–35%, nitrogen 1–5%, and oxygen 61–67%.

21. The method according to claim 11 further comprising:
    forming source and drain regions in said semiconductor substrate adjacent to said first and second gate transistors;
    depositing an insulating layer overlying said semiconductor substrate and said first and second gate transistors;
    opening contact holes through said insulating layer to underlying said source and drain regions;
    filling said contact holes with a conducting layer and patterning said conducting layer; and
    depositing a passivation layer overlying said patterned conducting layer to complete said integrated circuit device.

22. A method for fabricating an integrated circuit device comprising:
    providing an isolation region separating a first active area from a second active area in a semiconductor substrate;
    forming a nitrogen-rich silicon nitride layer overlying said semiconductor substrate in said first and second active areas;
    removing said nitrogen-rich silicon nitride layer in said second active area;
    forming an oxygen-rich silicon oxynitride layer in said second active area;
    depositing a polysilicon layer overlying said nitrogen-rich silicon nitride layer and said oxygen-rich silicon oxynitride layer;
    patterning said polysilicon layer, said nitrogen-rich silicon nitride layer, and said oxygen-rich silicon oxynitride layer to form a first gate transistor in said first active area having said nitrogen-rich silicon nitride layer thereunder and to form a second gate transistor in said second active area having said oxygen-rich silicon oxynitride layer thereunder;
    forming source and drain regions in said semiconductor substrate adjacent to said first and second gate transistors;

depositing an insulating layer overlying said semiconductor substrate and said first and second gate transistors;

opening contact holes through said insulating layer to underlying said source and drain regions;

filling said contact holes with a conducting layer and patterning said conducting layer; and depositing a passivation layer overlying patterned said conducting layer to complete said integrated circuit device.

23. The method according to claim 22 wherein said nitrogen-rich silicon nitride layer has a physical thickness of between about 20 and 100 Angstroms.

24. The method according to claim 22 wherein said nitrogen-rich silicon nitride layer is formed by LPCVD silicon nitride wherein a first buffer oxide layer is formed to a thickness of between about 5 and 10 Angstroms underlying a silicon nitride layer.

25. The method according to claim 22 wherein said nitrogen-rich silicon nitride layer is formed by LPCVD silicon nitride wherein a first buffer oxynitride layer is formed to a thickness of between about 5 and 10 Angstroms underlying a silicon nitride layer.

26. The method according to claim 22 wherein said nitrogen-rich silicon nitride layer is formed by RTCVD silicon nitride wherein a first buffer oxynitride layer is formed to a thickness of between about 5 and 10 Angstroms underlying a silicon nitride layer.

27. The method according to claim 26 further comprising annealing said nitrogen-rich silicon nitride layer using one of the group containing $NH_3$ and $N_2O$.

28. The method according to claim 22 wherein said nitrogen-rich silicon nitride layer has a composition of silicon: 40–60%, nitrogen 40–70%, and oxygen 1–10%.

29. The method according to claim 22 wherein the physical thickness of said oxygen-rich silicon oxynitride layer is between about 30 and 100 Angstroms.

30. The method according to claim 22 wherein said oxygen-rich silicon oxynitride layer is grown by thermally growing a silicon dioxide layer and annealing said silicon dioxide layer using one of the group containing $NH_3$ and $N_2O$.

31. The method according to claim 22 wherein said oxygen-rich silicon oxynitride layer is grown by thermally growing a silicon oxynitride layer using one of the group containing NO and $N_2O$.

32. The method according to claim 22 wherein said oxygen-rich silicon oxynitride layer has a composition of silicon: 30–35%, nitrogen 1–5%, and oxygen 61–67%.

* * * * *